United States Patent
Harwalkar et al.

(10) Patent No.: US 10,164,593 B1
(45) Date of Patent: *Dec. 25, 2018

(54) ACCURATE, LOW-POWER POWER DETECTOR CIRCUITS AND RELATED METHODS USING PROGRAMMABLE REFERENCE CIRCUITRY

(71) Applicant: Silicon Laboratories Inc., Austin, TX (US)

(72) Inventors: Navin Harwalkar, Austin, TX (US); John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/697,940

(22) Filed: Sep. 7, 2017

(51) Int. Cl.
*H03G 3/20* (2006.01)
*H02M 1/00* (2006.01)
*H02M 3/156* (2006.01)
*G05F 1/10* (2006.01)
*H03M 1/66* (2006.01)

(52) U.S. Cl.
CPC ............. *H03G 3/20* (2013.01); *G05F 1/10* (2013.01); *H03M 1/66* (2013.01)

(58) Field of Classification Search
CPC .. H03G 3/20; H03M 1/66; G05F 1/10; H04W 52/00–52/60
USPC ........................................... 323/299
See application file for complete search history.

(56) References Cited

U.S. PATENT DOCUMENTS

| | | | | |
|---|---|---|---|---|
| 4,602,218 A | * | 7/1986 | Vilmur | H03G 3/3042 330/129 |
| 5,204,637 A | * | 4/1993 | Trinh | H03G 3/3042 330/129 |
| 5,224,011 A | | 6/1993 | Yalla et al. | |
| 5,646,578 A | * | 7/1997 | Loh | H03G 3/3042 330/279 |
| 5,764,541 A | | 6/1998 | Hermann et al. | |

(Continued)

OTHER PUBLICATIONS

Received STIC search report from EIC 2800 searcher Mesfin Getaneh on Mar. 9, 2018.*

(Continued)

*Primary Examiner* — Timothy J Dole
*Assistant Examiner* — Htet Z Kyaw
(74) *Attorney, Agent, or Firm* — Egan Peterman Enders Huston

(57) ABSTRACT

Embodiments of power detector circuits and related methods to compensate for undesired DC offsets generated within power detector circuits are disclosed. Input signals having input frequencies are received and converted to a magnitude signal, and reference signals are also generated. The magnitude signal may include a DC component proportional to a power of the input signal along with undesired DC offsets. The reference signal may include a DC component proportional to a power of at least one input reference signal along with undesired DC offsets. To compensate for errors introduced by the DC offsets, a programmable digital input signal is determined in a calibration mode and then applied to reference circuitry in a normal mode to compensate for the DC offsets. For the calibration mode, a difference between the magnitude signal and the reference signal is compared to a threshold value to generate a power detection output signal.

20 Claims, 9 Drawing Sheets

(56) References Cited

U.S. PATENT DOCUMENTS

| | | | |
|---|---|---|---|
| 6,519,293 B1* | 2/2003 | Miyake | H03G 3/3047 375/296 |
| 6,678,506 B1 | 1/2004 | Dolman et al. | |
| 6,845,232 B2 | 1/2005 | Darabi | |
| 7,099,643 B2 | 8/2006 | Lin | |
| 7,259,630 B2 | 8/2007 | Bachman, II et al. | |
| 7,532,869 B2 | 5/2009 | Ehrenreich et al. | |
| 7,808,322 B1* | 10/2010 | Son | H03G 3/3042 330/130 |
| 8,390,262 B2* | 3/2013 | Chang | H05B 33/0818 315/209 R |
| 8,428,534 B1 | 4/2013 | Kummaraguntla et al. | |
| 8,912,785 B2 | 12/2014 | Horvath | |
| 2004/0198257 A1* | 10/2004 | Takano | H03G 3/3047 455/108 |
| 2006/0055388 A1* | 3/2006 | Tang | H02M 3/1584 323/284 |
| 2006/0111071 A1* | 5/2006 | Paulus | H04B 1/30 455/302 |
| 2006/0222115 A1* | 10/2006 | Dornbusch | H04N 5/52 375/345 |
| 2007/0182490 A1* | 8/2007 | Hau | H03F 1/0227 330/297 |
| 2007/0298733 A1* | 12/2007 | Cole | H04B 17/101 455/114.2 |
| 2008/0181337 A1 | 7/2008 | Maxim | |
| 2009/0224685 A1* | 9/2009 | De Brouwer | H05B 41/2887 315/291 |
| 2009/0247102 A1* | 10/2009 | Hsieh | H04B 1/30 455/226.1 |
| 2009/0264091 A1* | 10/2009 | Jensen | H03G 3/3047 455/296 |
| 2010/0172450 A1 | 7/2010 | Komaili et al. | |
| 2010/0264984 A1* | 10/2010 | Gomez | H03F 1/52 330/124 R |
| 2010/0277240 A1 | 11/2010 | Qiu et al. | |
| 2011/0102047 A1 | 5/2011 | Sun et al. | |
| 2011/0244820 A1* | 10/2011 | Khoini-Poorfard | H04B 1/30 455/255 |
| 2013/0120068 A1* | 5/2013 | Mehrmanesh | H03G 1/007 330/282 |
| 2014/0103998 A1* | 4/2014 | Mehrmanesh | H03G 1/007 330/254 |
| 2018/0007649 A1* | 1/2018 | Dal Maistro | H04W 56/0035 |

OTHER PUBLICATIONS

Harwalkar et al., "Accurate, Low-Power Power Detector Circuits and Related Methods", U.S. Appl. No. 15/697,859, filed Sep. 7, 2017, 41 pgs.

Notice of Allowance dated May 3, 2018, Harwalkar et al., "Accurate, Low-Power Power Detector Circuits and Related Methods", U.S. Appl. No. 15/697,859, filed Sep. 7, 2017, 11 pgs.

* cited by examiner

ACCURATE, LOW-POWER POWER DETECTOR CIRCUITS AND RELATED METHODS USING PROGRAMMABLE REFERENCE CIRCUITRY

RELATED APPLICATIONS

This application is related in subject matter to concurrently filed U.S. patent application Ser. No. 15/697,859, which is entitled "ACCURATE, LOW-POWER POWER DETECTOR CIRCUITS AND RELATED METHODS," which is hereby incorporated by reference in its entirety.

BACKGROUND

1. Field of the Disclosure

This disclosure relates to power detector circuits and, more particularly, to power detector circuits and methods to improve the accuracy of power detector circuits.

2. Description of the Relevant Art

The following descriptions and examples are provided as background only and are intended to reveal information that is believed to be of possible relevance to the present disclosure. No admission is necessarily intended, or should be construed, that any of the following information constitutes prior art impacting the patentable character of the subject matter claimed herein.

Automatic Gain Control (AGC) circuits are used in many systems where the amplitude of an incoming signal can vary over a wide dynamic range. The primary role of an AGC circuit is to provide a relatively constant output amplitude and to prevent saturation or signal clipping in the signal chain, even as the amplitude of the input signal varies, so that circuits following the AGC circuit require less dynamic range. AGC circuits can be found in any system or device where signal saturation, clipping and/or wide amplitude variations in the output signal could lead to a loss of information or unacceptable system performance. For instance, AGC circuits are commonly used in wireless receivers, radar systems, audio/video devices and telephone systems, to name a few.

As a non-limiting example, a wireless receiver may include an AGC circuit to adjust the gain of one or more amplifiers included within the receiver to compensate for the wide dynamic range of a received radio frequency (RF) signal. The AGC circuits included within wireless receivers typically include a power detector to adjust the amplifier gain(s) for optimal performance in response to variations in incoming RF power. More specifically, a power detector is used to measure and limit the power seen by the RF circuits in a wireless receiver. Power detectors must, therefore, be capable of accurately detecting very high frequency signals (e.g., about 10 MHz to about 10 GHz) of small to moderate amplitudes, while consuming as little power as possible.

In a well-designed receiver, the power detector should consume a small fraction of the power of the RF signal path circuits, like Low-Noise Amplifiers (LNAs) and mixers. While state-of-the-art power detectors achieve some combination of the abovementioned objectives, they do not achieve all. For example, a conventional power detector may achieve high accuracy at the expense of high power consumption (or vice versa). A need, therefore, exists for an improved power detector and method that provides accurate power detection, while consuming very little power and die area and reducing capacitive loading on the RF signal path.

SUMMARY

The following description of various embodiments of power detector circuits and methods is not to be construed in any way as limiting the subject matter of the appended claims.

Generally speaking, the present disclosure provides various embodiments of power detector circuits and methods that improve the accuracy of power detector circuits, without increasing power or area consumption, or substantially increasing circuit complexity.

For one embodiment, a power detector circuit is disclosed including input circuitry, reference circuitry, comparison circuitry, and error compensation circuitry. The input circuitry is coupled to receive an input signal having an input frequency and is configured to generate a magnitude signal including a DC component proportional to power of the input signal. The reference circuitry is coupled to receive a programmable digital input signal corresponding to an input reference signal, and is further configured to generate a reference signal including a DC component. The comparison circuitry is configured to compare the magnitude signal and the reference signal, and is further configured to generate a power measurement signal in response to the comparison. The error compensation circuitry is configured, in a calibration mode, to select a programmable digital input signal based on the power measurement signal, and the error compensation circuitry is coupled, in a normal mode, to supply the programmable digital input signal to the reference circuitry to compensate for one or more DC offsets generated by the input circuitry or the reference circuitry.

In additional embodiments, the comparison circuitry is configured to compare a difference between the magnitude signal and the reference signal to a threshold value. In further embodiments, the comparison circuitry is configured to directly compare the magnitude signal to the reference signal. In still further embodiments, the input circuitry includes a first non-linear element coupled to receive the input signal and configured to generate the magnitude signal.

In additional embodiments, the reference circuitry includes a pair of digital-to-analog converters (DACs) and a pair of non-linear elements. The pair of DACs are coupled to receive a pair of programmable digital inputs and configured to generate equal and opposite reference signals corresponding thereto. The pair of non-linear elements are coupled to receive the equal and opposite reference signals and configured to generate the reference signal.

In additional embodiments, the power detector circuit further includes a first switch coupled to supply the input signal to the input circuitry during the normal mode for the power detector circuit and a second switch coupled to supply a calibration signal to the input circuitry during the calibration mode for the power detector circuit.

In additional embodiments, the power detector circuit further includes a signal generator coupled to the second switch and configured to generate the calibration signal with an adjustable amplitude and frequency. In further embodiments, the signal generator includes a clock source configured to generate the calibration signal with a selected frequency and a programmable attenuator configured to scale an amplitude of the calibration signal.

In additional embodiments, the error compensation circuitry is coupled to the first switch, the second switch, the reference circuitry, and the comparison circuitry. In further embodiments, the error compensation circuitry, in the calibration mode, is configured to open the first switch and close the second switch to supply the calibration signal to the input circuitry, to receive the power measurement signal from the comparison circuitry, and to adjust the programmable digital input signal based upon the power measurement signal. In still further embodiments, the error compensation circuitry, in the normal mode, is configured to close the first switch and open the second switch to supply the input signal to the input circuitry and to supply the adjusted programmable digital input signal to the reference circuitry.

For one embodiment, a method to detect power is disclosed. With input circuitry, the method includes receiving an input signal having an input frequency and generating a magnitude signal including a DC component proportional to power of the input signal. With reference circuitry, the method includes receiving a programmable digital input signal corresponding to an input reference signal and generating a reference signal including a DC component based upon the programmable digital input signal. The method further includes comparing the magnitude signal and the reference signal and generating a power measurement signal in response to the comparison. Further, in a calibration mode, the method includes selecting a programmable digital input signal based on the power measurement signal; and in a normal mode, the method includes applying the programmable digital input signal to the reference circuitry to compensate for one or more DC offsets generated by the input circuitry or the reference circuitry.

In additional embodiments, the comparing includes comparing a difference between the magnitude signal and the reference signal to a threshold value. In further embodiments, the comparing includes directly comparing the magnitude signal to the reference signal. In still further embodiments, the input circuitry includes a first non-linear element coupled to receive the input signal and configured to generate the magnitude signal.

In additional embodiments, the reference circuitry includes a pair of digital-to-analog converters (DACs) and a pair of non-linear elements. The pair of digital-to-analog converters (DACs) are coupled to receive a pair of programmable digital inputs, and generating equal and opposite reference signals corresponding thereto. The pair of non-linear elements receive the equal and opposite reference signals and generating the reference signal.

In additional embodiments, the method includes closing a first switch to supply the input signal to the input circuitry during the normal mode for the power detector circuit, and closing a second switch to supply a calibration signal to the input circuitry during the calibration mode for the power detector circuit. In further embodiments, the method includes using a signal generator to generate the calibration signal with an adjustable amplitude and frequency. In still further embodiments, the method includes, in the calibration mode, opening the first switch and closing the second switch to supply the calibration signal to the input circuitry, receiving the power measurement signal, and adjusting the programmable digital input signal based upon the power measurement signal. In additional further embodiments, the method includes, in the normal mode, closing the first switch and opening the second switch, supplying the input signal to the input circuitry, and supplying the adjusted programmable digital input signal to the reference circuitry.

Different or additional features, variations, and embodiments can be implemented, if desired, and related systems and methods can be utilized, as well.

BRIEF DESCRIPTION OF THE DRAWINGS

Other objects and advantages of the disclosure will become apparent upon reading the following detailed description and upon reference to the accompanying drawings.

Figure 1:
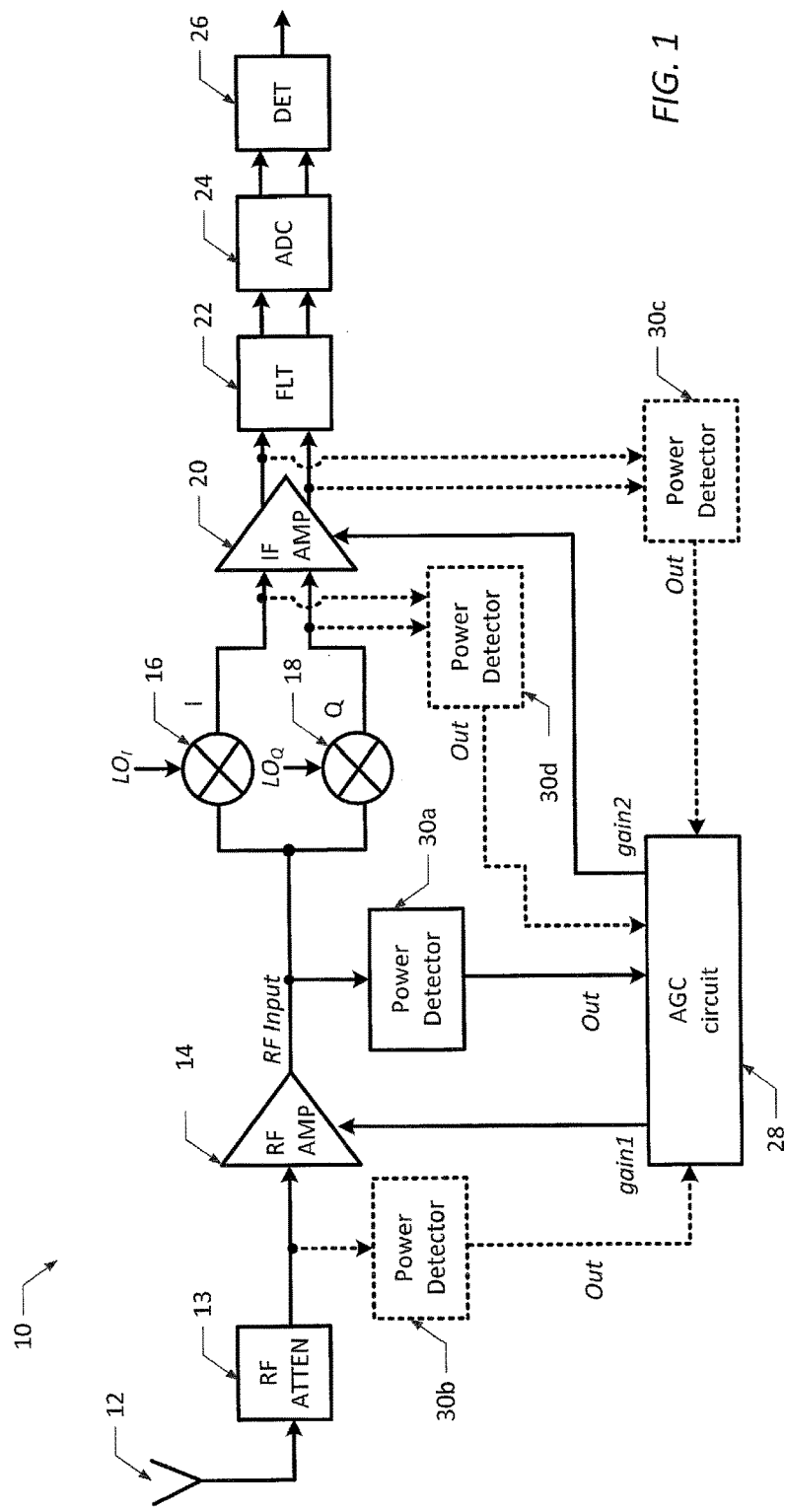
FIG. 1 is a block diagram of an exemplary wireless receiver including a power detector circuit.

While the embodiments of power detector circuits and methods disclosed herein are susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the disclosure is intended to cover all modifications, equivalents and alternatives falling within the spirit and scope of the present disclosure as defined by the appended claims.

DETAILED DESCRIPTION OF PREFERRED EMBODIMENTS

In general, the present disclosure provides various embodiments of power detector circuits that improve upon conventional power detector circuits by improving accuracy, while decreasing power and area consumption of the power detector circuit and reducing capacitive loading on the RF signal path. In particular, the present disclosure provides improved power detector circuits, improved methods to calibrate power detector circuits and improved methods to compensate for the effects of DC offsets in power detector circuits. According to one embodiment, a power detector circuit in accordance with the present disclosure may be included within a wireless receiver that uses an automatic gain control (AGC) circuit to adjust the gain of one or more amplifiers included within the receiver. An exemplary wireless receiver utilizing a quadrature down-conversion scheme is illustrated in FIG. 1 and described in detail below. It is noted, however, that the embodiments of power detectors and methods described herein are not strictly limited to use within wireless receivers using a quadrature down-conversion scheme, and may be used within any system or device where peak or power detection is needed.

FIG. 1 illustrates one embodiment of an exemplary wireless receiver 10 including a power detector 30 in accordance with the present disclosure, which can be positioned in various locations. Example locations for the power detector 30 are indicated by element numbers 30a, 30b, 30c, and 30d although other locations could also be used to detect input signal power. In the embodiment shown in FIG. 1, a radio frequency (RF) signal received by antenna 12 is supplied to RF attenuator 13 and RF amplifier 14, where it is amplified by a first gain (gain 1). Although not limited to such, RF amplifier 14 may be a low noise amplifier (LNA), or any other amplifier typically included in wireless receivers. Once amplified, the RF signal is supplied to a pair of mixers 16 and 18, which convert the amplified RF signal into intermediate frequency (IF) signals having in-phase (I) and quadrature phase (Q) components using local oscillator mixing signals ($LO_I$, $LO_Q$). The I and Q signals are generally equal in amplitude, but differ in phase by 90°. In order to maintain accurate amplitude and phase relationships between these signals, wireless receiver 10 includes identical or substantially identical analog circuitry in I and Q channels to process the I and Q signals.

In the embodiment shown in FIG. 1, the I and Q signals generated by mixers 16, 18 are supplied to an intermediate frequency (IF) amplifier 20, where they are amplified by a second gain (gain 2). Although not limited to such, IF amplifier 20 may be a programmable gain amplifier (PGA). Once amplified, the I and Q signals are filtered by filter 22, digitized by analog-to-digital converter (ADC) 24 and demodulated into digital data bits by detector 26. Although illustrated as singular blocks in FIG. 1, it is generally understood that IF amplifiers 20, filters 22, ADCs 24 and detectors 26 may be included within the receiver to separately process the signals in the I and Q channels.

In some cases, the amplitude of the RF signal received by antenna 12 may vary over a wide dynamic range, and such variance may adversely affect receiver performance. For example, received RF signals with amplitudes that are too high or too low may not be accurately detected by wireless receiver 10, due to receiver saturation (when the RF signal amplitude is too high) or sensitivity limitations (when the RF signal amplitude is too low). For this reason, an automatic gain control (AGC) circuit 28 may be included in a feedback loop (or alternatively, in a feedforward loop) to compensate for variations in the received signal strength by adjusting the gains (gain 1, gain 2) applied to the RF and IF signals by the RF and IF amplifiers 14 and 20 respectively.

In the embodiment shown in FIG. 1, power detector circuit 30a-d is used by AGC circuit 28 to control the amount of gain applied to the RF and IF amplifiers 14 and 20. In the illustrated embodiment, power detector circuit 30a measures the power of the amplified RF input signal generated by RF amplifier 14, and provides the results (Out) of the power measurement to AGC circuit 28. In one example, power detector circuit 30 measures the power of the amplified RF input signal by performing a squaring operation on the amplified RF input signal, and compares the result of the squaring operation to one or more thresholds to generate the power measurement signal. AGC circuit 28 uses the power measurement signal provided by power detector circuit 30 to control the gains (gain 1, gain 2) respectively applied to the RF/IF signals by amplifiers 14 and 20. For example, AGC circuit 28 may increase or decrease the gains of the RF/IF amplifiers 14 and 20 depending on whether the RF/IF signal is too weak or too strong, respectively.

It should be again noted that the input of power detector circuit 30a is not limited to the output of RF amplifier 14, and could be connected elsewhere within the received signal path (e.g., anywhere between antenna 12 and output of filter 22). In alternative embodiments, as shown in dotted lines with respect to power detector circuits 30b-d, the power detector circuit connected at different locations. For example, the input of power detector circuit 30b may be coupled to the input, rather than the output, of RF amplifier 14. In other alternative embodiments, the input of power detector circuits 30c and 30d may additionally or alternatively be coupled to receive the I and Q signals at the IF frequency (e.g. the output of mixers 16 and 18, or the output of IF amplifier 20). In yet another alternative embodiment, the power detector input may be limited to an input of only one of the phases, e.g., either I signal or the Q signal. It should be further understood that, while illustrated for use within a wireless receiver that utilizes a quadrature down-conversion scheme to an intermediate frequency, embodiments of the power detector circuit 30 shown and described herein are not strictly limited to such, and other receiver architectures could also be used.

The accuracy of power detector circuit 30 is an important factor in ensuring that the RF and/or IF signals are amplified appropriately within wireless receiver 10. If power detector circuit 30 suffers from large errors, the RF and/or IF amplifiers may over amplify the RF and/or IF signals causing saturation problems, or may under amplify the signals causing the signals to be too weak to process. Power and area consumption is another concern when designing wireless receivers and other systems and devices, which use a power detector circuit to measure the power of a received signal. Further, the input capacitance of the power detector circuit is an important metric as it loads the main RF signal path. It is desirable to minimize this loading.

In some conventional power detector circuits, the amplified RF input signal produced by an RF amplifier may be further amplified by a preamplifier (e.g., a fixed gain amplifier, not shown) to generate a large enough input signal (e.g., more than 100 mV) for the power detector to accurately detect and measure. In these power detectors, the preamplifiers introduce their own errors and consume significant power. In other conventional power detector circuits, complex circuitry may be used to carefully match the response of the squaring elements in an attempt to avoid generating offset errors in those elements. While accuracy is improved, these conventional power detector circuits tend to consume relatively large amounts of power and area, which may be problematic for systems and devices in which power is limited (such as battery-operated devices) or space is limited (such as small form factor devices). A need, therefore, remains for an improved power detector circuit that provides high accuracy, lower power operation, is compact (i.e., uses very little die area) and places minimal capacitive loading on the RF signal path Various embodiments of accurate, low-power power detector circuits 30 and related methods are described below and illustrated in FIGS. 2-9. All embodiments of the disclosed power detector circuits 30 include input circuitry 70, reference circuitry 80, comparison circuitry 90, and error compensation circuitry 60. The input circuitry 70 is coupled to receive an input signal having a frequency (e.g., an RF input signal) and configured to generate a magnitude signal that includes a DC component proportional to the power of the input signal. However, this magnitude signal can also include an undesired DC offset that is potentially generated by the input circuitry 70 and represents an error component within the magnitude signal. The reference circuitry 80 is coupled to receive at least one input reference signal (or a digital input corresponding to at least one input reference signal) and is configured to generate a reference signal that includes a DC component proportional to the power of the input reference signal. However, like the magnitude signal, the reference signal can also include an undesired DC offset that is potentially generated by the reference circuitry 80 and represents an error component within the reference signal. The comparison circuitry 90 is configured to compare a difference between the magnitude signal and the reference signal to a threshold value (e.g., 0V or some other value), and to generate a power measurement signal in response to the comparison (e.g., one-bit output indicating whether the magnitude signal is greater than or less than the reference signal). It is also noted that for the power detector circuit embodiments described herein with respect to FIGS. 2-9, the "RF input signal" can be an oscillating input signal of any desired frequency from a few Hertz to 5-10 Gigahertz or more. Other variations could also be implemented while still taking advantage of the techniques described herein to accurately detect power for an input signal.

The undesired DC offsets generated within the power detector circuit can arise from a variety of sources, but are generally fixed and random in nature. Regardless of their origins, the DC offsets are errors, which are indistinguishable from the wanted DC signals (i.e., DC component within the magnitude signal that is proportional to the power of the input signal and the DC component within the reference signal that is proportional to the input reference signal). Without accurate compensation, the undesired DC offsets can degrade the accuracy of the power detector circuit. Although large device areas and/or large bias currents could be used to reduce these DC offset errors, doing so would increase the power and area consumption and the input capacitance of the power detector circuit, which is undesirable in many applications. For example, prior solutions have attempted to avoid generating DC offset errors by carefully matching squaring elements. Other high power, large circuit area, and/or high input capacitance solutions have also been attempted to eliminate these DC offset errors.

In contrast, the power detector circuits described herein include internal error compensation circuitry, which is configured to compensate for the DC offsets generated within the power detector circuit, without requiring such high power or large circuit area and without producing the high input capacitance. In one embodiment, the error compensation circuitry is configured to select an adjustable DC offset calibration signal (e.g., voltage and/or current) based on the power measurement signal, and is coupled to supply the selected DC offset calibration signal (e.g., voltage and/or current) to the input circuitry 70, or to the reference circuitry 80, to compensate for the undesired DC offsets. In another embodiment, the error compensation circuitry is configured to select an adjustable gain based on the power measurement signal, and is coupled to supply the selected gain to the input circuitry 70, or to the reference circuitry 80, to compensate for the undesired DC offsets. In yet another embodiment, the error compensation circuitry is configured to select an adjustable digital input value, which when supplied to the reference circuitry 80 generates a DC offset calibration signal that compensates for the DC offsets. Other embodiments of the power detector circuit described herein may utilize other techniques to compensate for the DC offsets.

Figure 2:
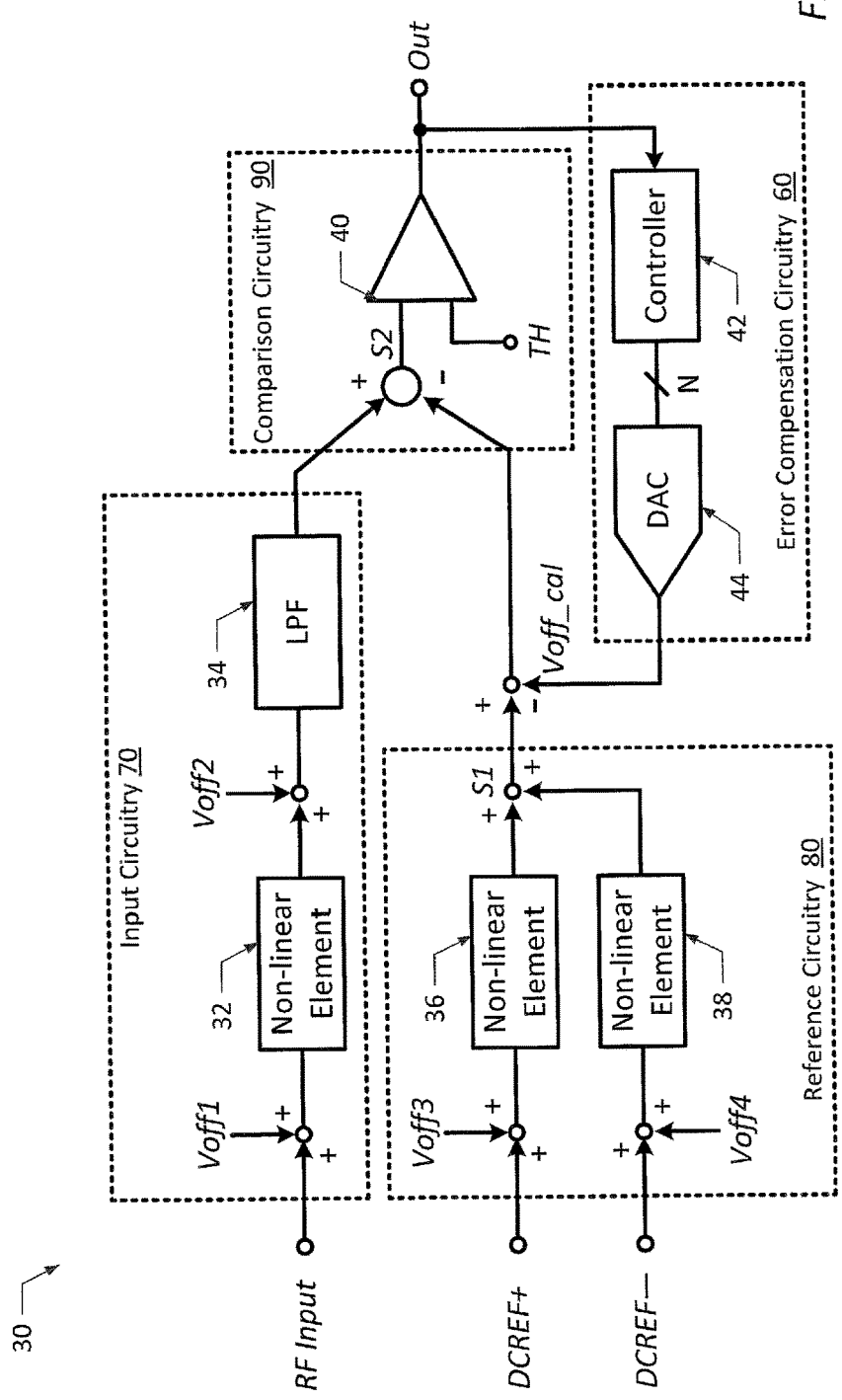
FIG. 2 is a block diagram illustrating one embodiment of a power detector circuit in accordance with the present disclosure.
Figure 4:
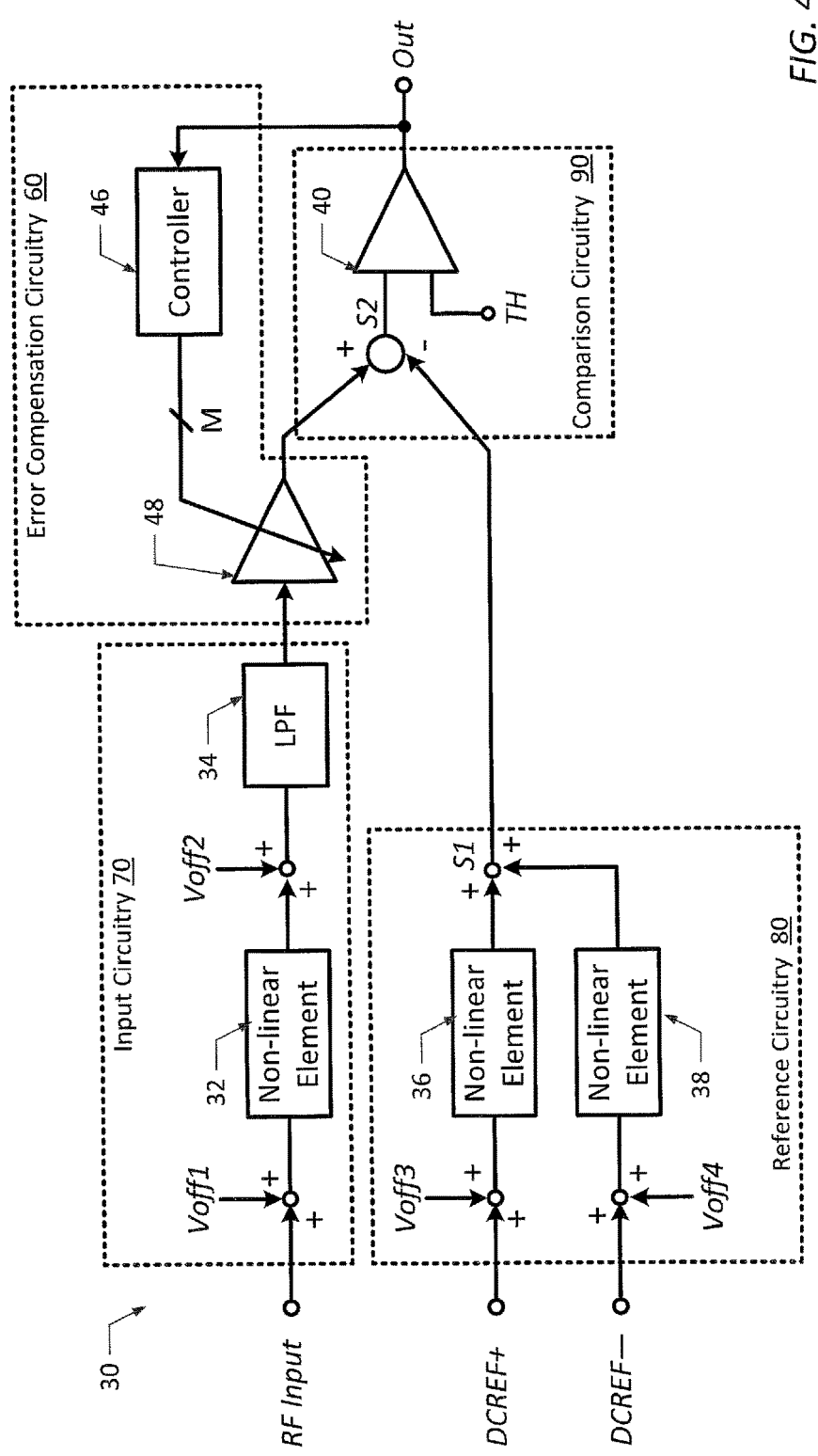
FIG. 4 is a block diagram illustrating another embodiment of a power detector circuit in accordance with the present disclosure.
Figure 8:
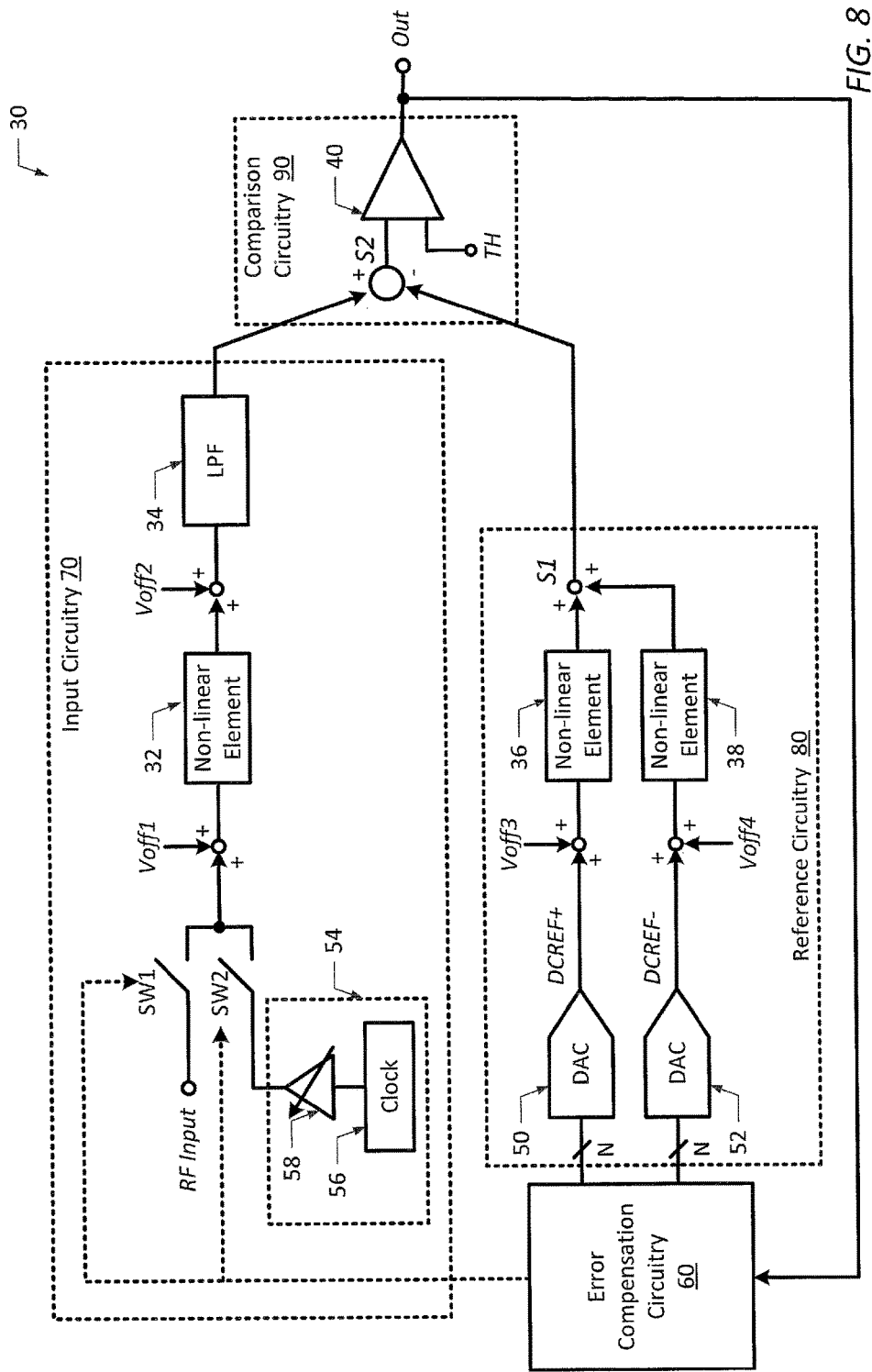
FIG. 8 is a block diagram illustrating yet another embodiment of a power detector circuit in accordance with the present disclosure.

Various embodiments of a power detector circuit 30 in accordance with the present disclosure are shown in block diagram form in FIGS. 2, 4 and 8. As noted above, each of these embodiments include input circuitry 70, reference circuitry 80, comparison circuitry 90, and error compensation circuitry 60. As shown in FIGS. 2, 4 and 8, the input circuitry 70 includes a non-linear element 32 and a low pass filter (LPF) 34, which is used to convert an RF input signal into a magnitude signal. In one embodiment, non-linear element 32 may be a squaring element, which generates a proportional component at the same frequency as the RF input signal frequency, a DC component proportional to the power (i.e., the mean-squared value) of the RF input signal, and a component that is twice the RF input signal frequency. The LPF 34 following the squaring element 32 filters out the proportional frequency component and the twice-frequency component, leaving only the DC component, which is proportional to the power of the RF input signal. As described above, one or more undesirable DC offsets (e.g., Voff1 and Voff2) can also be generated by the input circuitry 70 within the power detector circuit 30.

The reference circuitry 80 shown in FIGS. 2, 4 and 8 uses a pair of non-linear elements 36 and 38 to convert a pair of input reference signals into a reference signal. In one embodiment, the pair of non-linear elements 36 and 38 may be squaring elements that are nominally matched to each other and to the squaring element 32 included within the input circuitry 70. Equal and opposite DC input reference voltages (DCREF+ and DCREF−) are supplied to squaring elements 36 and 38, and the outputs of the squaring elements are summed at summing node, S1, to cancel out the proportional component and odd-order non-linearities. The DC input reference voltages are generally equal and opposite with respect to some common mode level (e.g., about 0.4V to about 1.0V, depending on process). In this manner, the reference signal output from the summing node, S1, includes a DC voltage proportional to the power of the DC input reference voltages. As described above, one or more undesirable DC offsets (e.g., Voff3 and Voff4) can also be generated by the reference circuitry 80 within the power detector circuit 30.

Figure 3:
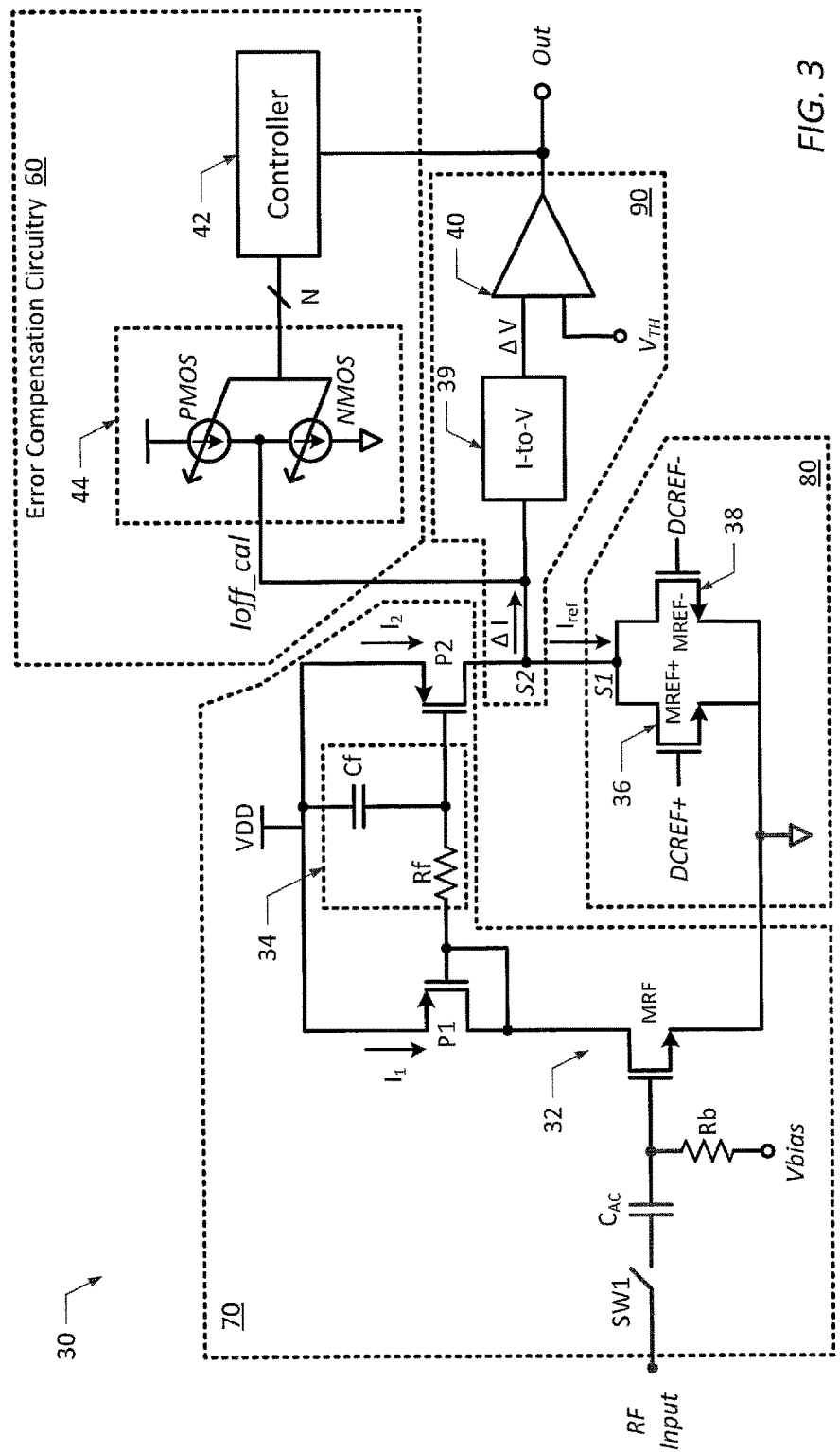
FIG. 3 is a simplified circuit diagram illustrating one embodiment of the power detector circuit shown in FIG. 2.
Figure 5:
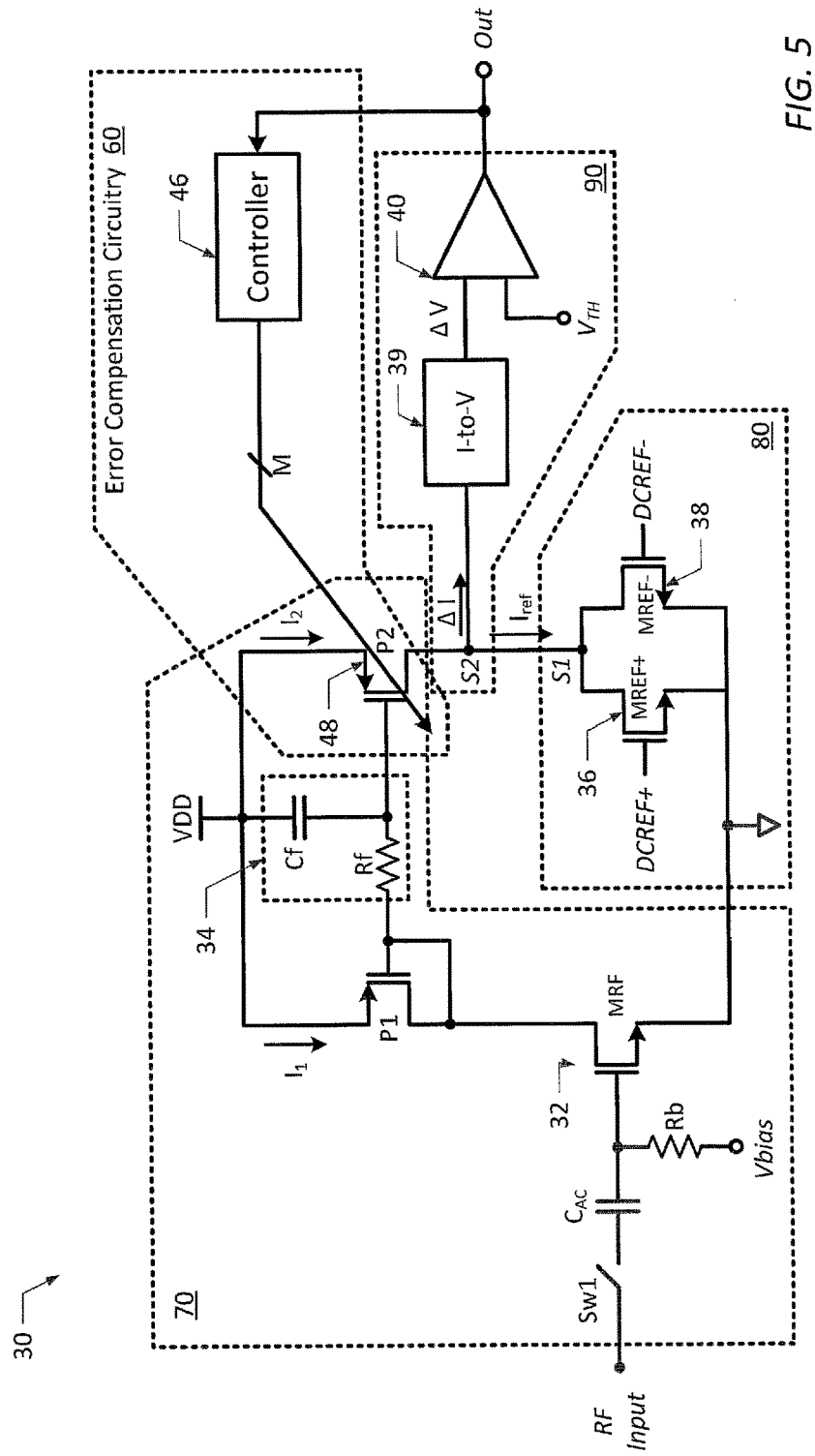
FIG. 5 is a simplified circuit diagram illustrating one embodiment of the power detector circuit shown in FIG. 4.

The squaring elements 32, 36 and 38 may be implemented in a variety of different ways, including but not limited to, a transistor biased in saturation, or a multiplier or mixer that multiplies the signal with itself. Although one example of a squaring element (e.g., a transistor biased in saturation, such as transistors MRF, MREF+, MREF−) is shown in the embodiments of FIGS. 3 and 5 and described below, the non-linear elements (32, 36 and 38) included within the input and reference circuitry 80 are not limited to such a squaring element, nor are they strictly limited to performing a squaring operation. In some embodiments, the non-linear elements 32, 36 and 38 included within the input and reference circuitry 80 may have a polynomial representation that uses higher-order terms. In other embodiments, one or more of the non-linear elements 32, 36 and 38 can be implemented with a peak track and hold circuit, which does not necessarily have a polynomial representation.

The comparison circuitry 90 shown in FIGS. 2, 4 and 8 compares a difference between the magnitude signal and the reference signal with a threshold value (TH), and generates a power measurement signal (Out) based on the comparison results. The difference signal between the magnitude signal and the reference signal is generated by the summing node, S2. Further, this difference is than compared by a comparator 40 to a threshold value (TH). The threshold value may be 0V, for example, or some other value. In one example embodiment, the power measurement signal (Out) may be a one-bit digital signal output by the comparator 40 that indicates whether the power of the difference signal is greater, or smaller, than the threshold voltage ($V_{TH}$). It is noted that for additional embodiments, another signal can be input into the comparator 40 as the comparison signal (e.g., direct DC input reference signal in FIG. 9 or other signal). In some embodiments, comparator 40 may be implemented as a current comparator. Alternatively, comparator 40 may be implemented as a voltage comparator as shown in the example embodiments of FIGS. 3 and 5. In some embodiments, the power measurement signal (Out) generated by comparator 40 may be supplied to AGC circuit 28, and the AGC circuit 28 can use this power measurement output signal to control the gain(s) supplied to one or more amplifiers, as discussed herein. Other variations could also be implemented.

The random variables Voff1, Voff2, Voff3, and Voff4 shown in FIGS. 2, 4 and 8 represent DC offset errors, which are undesirable and may be generated by the circuitry within the power detector circuit. As noted above, error compensation circuitry 60 is included within the power detector circuits 30 described herein to compensate for these DC offset errors, thereby improving the accuracy of the power measurement signal (Out) without adversely affecting the amount of power and area consumed by the disclosed power detector circuits. Various embodiments of error compensation circuitry 60 are illustrated in block diagram form in FIGS. 2, 4 and 8 and described in more detail below.

FIG. 2 illustrates a first embodiment of power detector circuit 30, which includes error compensation circuitry that is configured to select an adjustable DC calibration signal (Voff_cal) based on the power measurement signal (Out), and is coupled to supply the selected DC calibration signal to the input circuitry 70, or to the reference circuitry 80, to compensate for the DC offsets (Voff1, Voff2, Voff3, and Voff4) generated within the power detector circuit. In the illustrated embodiment, the error compensation circuitry includes controller 42 and digital-to-analog converter (DAC) 44. Controller 42 is coupled to receive the power measurement signal (Out) from comparator 40, and is configured to select an N-bit programmable digital input value that ensures the selected DC calibration signal (Voff_cal) will compensate for the DC offsets (Voff1, Voff2, Voff3, and Voff4). According to one embodiment, controller 42 is a digital control block that receives a one-bit digital input signal (Out) and generates an N-bit digital output. Controller 42 can be implemented as a custom state machine, or alternatively, in software/firmware running on a microcontroller or a processor. DAC 44 is coupled to receive the N-bit programmable digital input value from controller 42, and is configured to generate the selected DC calibration signal in response thereto.

In the embodiment shown in FIG. 2, the error compensation circuitry 60 injects the selected DC calibration signal (Voff_cal) into the reference circuitry 80 path at the output of non-linear elements 36, 38. However, the selected DC calibration signal could be injected at substantially any point within power detector circuit 30 to provide the same results, although the value of the calibration signal (Voff_cal) might be different depending on where it is injected. For example, the selected DC calibration signal could be injected into the input or the output of non-linear element 32, the output of low pass filter 34, or an input of comparator 40 to compensate for the DC offsets (Voff1, Voff2, Voff3, and Voff4) generated within the power detector circuit 30.

During a calibration phase, DAC 44 may be tuned to compensate for the undesired DC offsets (Voff1, Voff2, Voff3, and Voff4) and improve the accuracy of the power detector circuit 30. This may be accomplished, in one embodiment, by setting the RF input signal and the DC input reference voltages (DCREF+ and DCREF−) to a common DC level and performing a binary search (or another kind of search algorithm) on the N-bit programmable digital input value using comparator 40 to make a decision at each step of the search. For example, controller 42 may repeatedly adjust the N-bit programmable digital input value supplied to DAC 44 until the difference between the magnitude signal and the reference signal is equal to the threshold value (TH). Once calibrated, the N-bit programmable digital input to the DAC 44 may be held constant and used to compensate for undesired DC offsets during normal operation of power detector circuit 30.

In the embodiment shown in FIG. 2, compensation is provided for the undesired DC offsets (Voff1, Voff2, Voff3, and Voff4) generated within the power detector circuit resulting in a significant improvement in power detection accuracy. In some cases, inclusion of the error compensation circuitry 60 shown in FIG. 2 reduces the error in the detected RF input power by a factor of 10 (or more). In addition to improving accuracy, the power detector circuit 30 shown in FIG. 2 has low power consumption and low input capacitance (which minimizes loading on the RF input signal path) over a wide input frequency range (e.g., approximately 10 MHz to 10 GHz), rendering it suitable for low power applications.

FIG. 3 is a simplified circuit diagram illustrating one embodiment of the power detector circuit 30 shown in FIG. 2. In the exemplary embodiment shown in FIG. 3, transistor MRF is the RF squaring element 32, and transistors MREF+ and MREF− are the reference squaring elements 36 and 38, respectively. The RF input signal is AC-coupled into the gate of transistor MRF through switch (SW1) and serial capacitor ($C_{AC}$). The gate of transistor MRF is biased resistively at bias voltage (Vbias) through resistor Rb. The DC input reference voltages, DCREF+ and DCREF−, are supplied to the gates of transistors MREF+ and MREF−, and are generated to be symmetrically above and below Vbias, respectively. A current mirror (transistors P1 and P2) coupled between RF squaring element 32 and the reference squaring elements 36 and 38 mirrors or copies current $I_1$ into current $I_2$. In some embodiments, $I_2$ can be a scaled version of $I_1$ (i.e., $I_2$ is not necessarily equal to $I_1$). In one embodiment, transistors P1 and P2 may be well-matched (i.e., have identical transistor widths and current densities), such that $I_1$ is substantially equal to $I_2$. When $I_1$ and $I_2$ are different, transistors P1 and P2 may still have the same current densities, but different transistor widths. This is accomplished by scaling the widths of transistors P1 and P2 by the same ratio as $I_1/I_2$.

In the embodiment shown in FIG. 3, a low-pass filter 34 including resistor Rf and capacitor Cf is coupled to the gates of transistors P1 and P2 to filter out the RF proportional component and the twice-frequency component, leaving only the DC component, which is proportional to the power of the RF input signal as well as any undesirable DC offsets, Voff1 and Voff2, generated by the input circuitry 70. In the embodiment of FIG. 3, Voff1 is the DC offset potentially introduced by transistor MRF, and Voff2 is the combined DC offset potentially introduced by transistors P1 and P2.

In the embodiment of FIG. 3, the difference (ΔI) between currents $I_2$ and $I_{REF}$ at summing node, S2, is supplied to current-to-voltage (I-to-V) converter 39, where the current difference (ΔI) is converted into a voltage (ΔV), which may be supplied to an input of voltage comparator 40. Voltage comparator 40 compares the voltage difference to a threshold voltage ($V_{TH}$) to generate the power measurement signal (Out). As noted above, the threshold value may be 0V, and the power measurement signal (Out) may be a one-bit digital signal that indicates whether the power of the magnitude signal is greater, or smaller, than the reference signal. Alternatively, I-to-V converter 39 may be omitted, and a current comparator 40 may be used to compare the current difference (ΔI) to a threshold current. Other variations could also be implemented.

In the embodiment of FIG. 3, DAC 44 is implemented using digitally programmable PMOS and NMOS current sources, which are capable of sourcing or sinking an offset calibration current (Ioff_cal) from or into summing node, S2, to compensate for the undesired DC offsets (Voff1, Voff2, Voff3, and Voff4) generated within the power detector circuit 30. It is noted that DAC 44 may be implemented differently, in other embodiments.

During calibration, the RF input signal is disconnected from power detector circuit 30 by turning OFF switch SW1, Vbias is supplied to the gate of transistor MRF, the DC input reference voltages (DCREF+ and DCREF−) are set equal to Vbias, and the N-bit programmable digital input is adjusted by controller 42 until the output of comparator 40 indicates that the voltage difference (ΔV) is equal to the threshold voltage ($V_{TH}$). When $\Delta V = V_{TH}$, the N-bit programmable digital input is stored as an N-bit calibration code, so that it may be later used to compensate for DC offsets during normal operation of the power detector circuit 30. In some embodiments, the N-bit programmable digital input may be stored within controller 42 or within other circuitry coupled to the power detector circuit 30. For example, the N-bit programmable digital input may be stored in any type of on-chip or off-chip memory in the form of a few flip-flops, random access memory (RAM), Flash memory, electrically erasable programmable read only memory (EEPROM) and/or any other type of read/write memory.

During normal operation, the RF input signal is connected to power detector circuit 30 by turning ON switch SW1, and the DC input reference voltages (DCREF+ and DCREF−) are set to values corresponding to a desired reference voltage. A DC current ($I_2$) proportional to the RF input power flows into summing node, S2, from above, while a DC current proportional to the DC reference power flows out of summing node, S2, from below. These two currents are subtracted at summing node, S2, and the difference (ΔI) flows into I-to-V converter 39 to generate a voltage (ΔV), which is compared with a threshold voltage ($V_{TH}$), which can be 0V or some other desired value, to determine whether the RF input power is above, or below, the threshold.

To improve power detection accuracy, the N-bit calibration code determined during the calibration phase is supplied to the digitally programmable PMOS and NMOS current sources within DAC 44 to generate an offset calibration current (Ioff_cal), which may be injected into summing node, S2, to compensate for the DC offsets generated within power detector circuit 30. In addition or alternatively, the threshold voltage ($V_{TH}$) supplied to comparator 40 and/or the DC input reference voltages (DCREF+ and DCREF−) supplied to reference squaring elements 36, 38 could be programmable values, which are adjusted to compensate for the DC offsets in power detector circuit 30.

FIG. 4 illustrates a second embodiment of power detector circuit 30, which includes error compensation circuitry 60 that is configured to select an adjustable gain based on the power measurement signal (Out), and is coupled to supply the selected gain to the input circuitry 70, or to the reference circuitry 80, to compensate the undesired DC offsets (Voff1, Voff2, Voff3, and Voff4) generated within the power detector circuit. In the illustrated embodiment, the error compensation circuitry 60 includes variable gain element 48 in the RF input signal path, and controller 46 which is coupled to control the gain of the variable gain element with an M-bit programmable digital value (a programmable gain value). Controller 46 is coupled to receive the power measurement signal (Out) from comparator 40, and is configured to select the M-bit programmable digital input value that ensures the selected gain will compensate for the undesired DC offsets (Voff1, Voff2, Voff3, and Voff4). According to one embodiment, controller 46 is a digital control block with a one-bit digital input signal (Out) and an M-bit digital output. Controller 46 can be implemented as a custom state machine, or alternatively, in software/firmware running on a microcontroller or a processor. Variable gain element 48 is coupled to receive the M-bit programmable digital value, and is configured to generate the selected gain in response thereto.

In the embodiment shown in FIG. 4, the error compensation circuitry 60 applies a programmable gain into the RF input signal path at the output of LFP 34. During a calibration phase, the gain of variable gain element 48 may be tuned to compensate for the undesired DC offsets (Voff1, Voff2, Voff3, and Voff4) and improve the accuracy of the power detector circuit 30. This may be accomplished, in one embodiment, by setting the RF input signal and the DC input reference voltages (DCREF+ and DCREF−) to a common DC level and performing a binary search (or another kind of search algorithm) on the M-bit programmable digital input value to adjust the gain of variable gain element 48 until the undesired DC offsets are negated at the input to comparator 40. For example, controller 46 may repeatedly adjust the M-bit programmable digital input value supplied to variable gain element 48 until the difference between the magnitude signal and the reference signal is equal to the threshold value (TH, e.g., 0V). Once calibrated, the M-bit programmable digital input may be stored, and later used to compensate for DC offsets during normal operation of the power detector circuit 30.

In the embodiment shown in FIG. 4, compensation is provided for the undesired DC offsets (Voff1, Voff2, Voff3, and Voff4) generated within the power detector circuit resulting in a significant improvement in power detection accuracy. In some cases, inclusion of the error compensation circuitry 60 shown in FIG. 4 may reduce the error in the detected RF input power by a factor of 10 (or more). In addition to improving accuracy, the power detector circuit 30 shown in FIG. 4 has low power consumption and low input capacitance (which minimizes loading on the RF input signal path) over a wide input frequency range (e.g., approximately 10 MHz to 10 GHz), rendering it suitable for low power applications.

FIG. 5 is a simplified circuit diagram illustrating one embodiment of the power detector circuit 30 shown in FIG. 4. The circuit diagram shown in FIG. 5 is substantially identical to the circuit diagram shown in FIG. 3 with one exception. Instead of using DAC 44 to inject a controllable DC offset voltage (or current) into the power detector circuit, current mirror transistor P2 may be implemented as a variable width transistor, whose gain can be controlled to compensate for the undesired DC offsets generated within the power detector circuit. As described in more detail below, a particular gain may be selected to compensate for the undesired DC offsets generated within the power detector circuit 30.

In the embodiment of FIG. 5, transistor P2 is the variable gain element 48, which is controlled by the M-bit programmable digital value (the programmable gain value) supplied by controller 46 to apply a controllable gain into the RF input signal path. In one embodiment, variable gain element 48 (e.g., transistor P2) may be implemented using an array of transistors with their gate and source terminals tied together. The drain terminals of each transistor in the transistor array can be connected to independently controlled switches, which can be used to adjust the effective width of the variable gain element, and thus, the gain in the current mirror. The M-bit programmable digital input is coupled to the switches to control the ON/OFF state of the switches.

During calibration, the RF input signal is disconnected from power detector circuit 30 by turning OFF switch SW1, Vbias is supplied to the gate of transistor MRF, the DC input reference voltages (DCREF+ and DCREF−) are set equal to Vbias, and the M-bit programmable digital input supplied to the variable gain element switches is adjusted by controller 46 until the output of comparator 40 indicates that the voltage difference (ΔV) is equal to the threshold voltage ($V_{TH}$, e.g., 0V). When the output of comparator 40 trips, the M-bit programmable digital input is stored as an M-bit gain control input, and used to compensate for the DC offsets generated during normal operation of the power detector circuit 30. In some embodiments, the M-bit programmable digital input may be stored within controller 46. Alternatively, the M-bit programmable digital input may be stored in any type of on-chip or off-chip memory in the form of a few flip-flops, random access memory (RAM), Flash memory, electrically erasable programmable read only memory (EEPROM) and/or any other type of read/write memory.

During normal operation, the RF input signal is connected to power detector circuit 30 by turning ON switch SW1, the DC input reference voltages (DCREF+ and DCREF−) are set to values corresponding to a desired reference voltage, and the M-bit gain control input determined during the calibration phase is supplied to the variable gain element switches to apply a predetermined amount of gain into the RF input signal path. A DC current ($I_2$) proportional to the RF input power, yet amplified by the previously determined gain, flows into summing node, S2, from above, while a DC current proportional to the DC reference power flows out of summing node, S2, from below. These two currents are subtracted at summing node, S2, and the difference (ΔI) flows into the I-to-V converter 39 to generate a voltage (ΔV), which is compared with a threshold voltage ($V_{TH}$, e.g., 0V) to determine whether the RF input power is above, or below, the threshold.

The embodiment shown in FIGS. 4 and 5 differs from the embodiment shown in FIGS. 2 and 3 by using gain correction, instead of DC offset calibration voltages/currents, to compensate for the DC offsets generated in the power detector circuit 30. Power detector circuit 30 is a non-linear system, whose RF-to-DC conversion gain is a strong function of the undesired DC offsets. Large DC offsets can increase or decrease the conversion gain, thereby requiring gain correction to compensate for such offsets. In the embodiment shown in FIGS. 4 and 5, gain correction is provided after the RF-to-DC conversion by configuring transistor P2 as the variable gain element 48.

Figure 6:
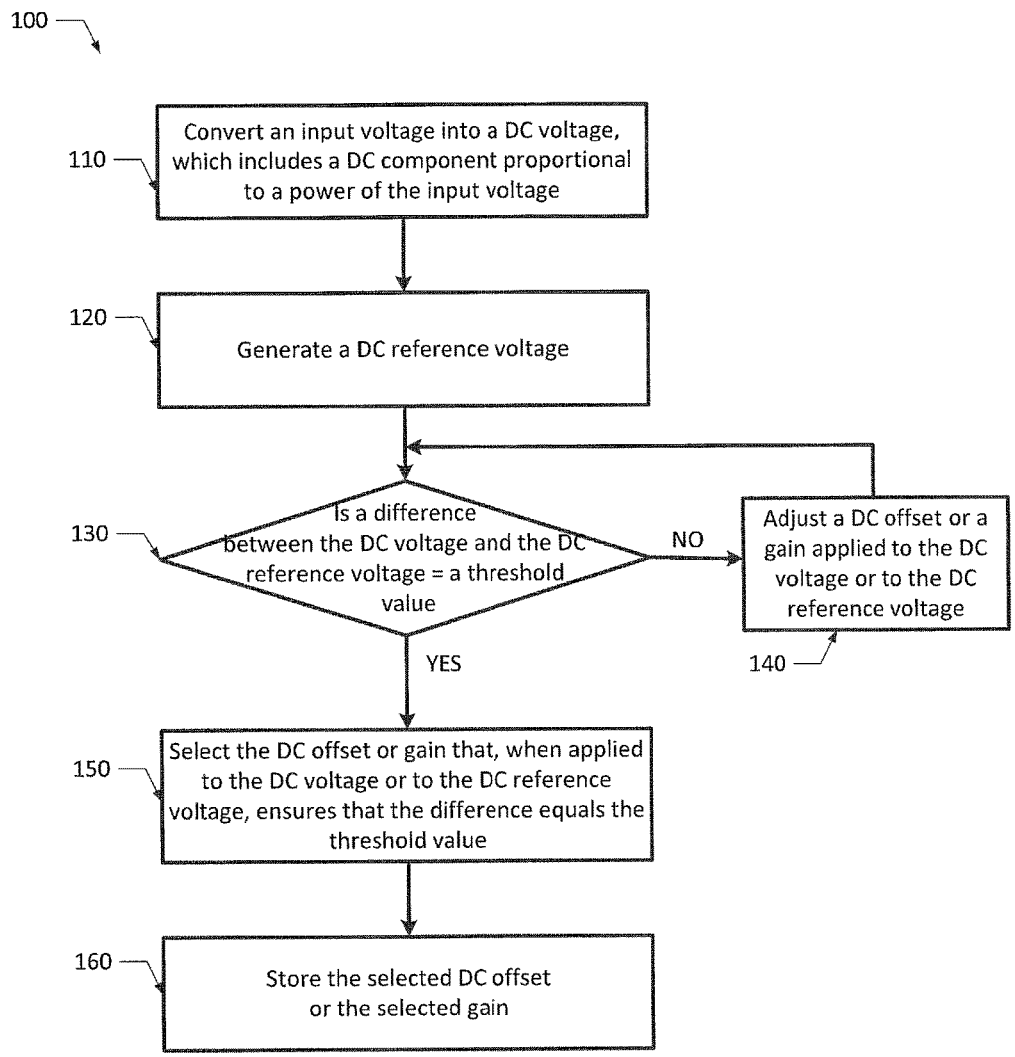
FIG. 6 is a flow chart illustrating one embodiment of a method for calibrating a power detector circuit.

FIG. 6 is a flow chart diagram illustrating one embodiment of a method 100 that may be used to calibrate a power detector circuit, as shown in the embodiments of FIGS. 2-5. In the illustrated embodiment, calibration method 100 begins in step 110 by converting an input voltage (e.g., Vbias) into a DC voltage, which includes a DC component proportional to the power of the input voltage. In step 120, the calibration method generates a DC reference voltage that includes a DC component proportional to a power of a reference voltage. In step 130, the calibration method compares a difference between the DC voltage and the DC reference voltage to a threshold value ($V_{TH}$). If the difference is not equal to the threshold value (NO branch of step 130), the calibration method in step 140 may adjust a DC offset calibration signal (e.g., voltage and/or current) or a gain applied to the DC voltage or to the DC reference voltage, and then return to step 130. In some embodiments, the calibration method may repeat the steps of comparing (step 130) and adjusting (step 140) until the difference is equal to the threshold (YES branch of step 130). In step 150, the calibration method selects the DC offset calibration signal or the gain that, when applied to the DC voltage or to the DC reference voltage, ensures that the difference equals the threshold value. The selected DC offset calibration signal or the selected gain is then stored in step 160. It is noted that additional and/or different steps could also be used for the calibration mode of operation as desired.

Figure 7:
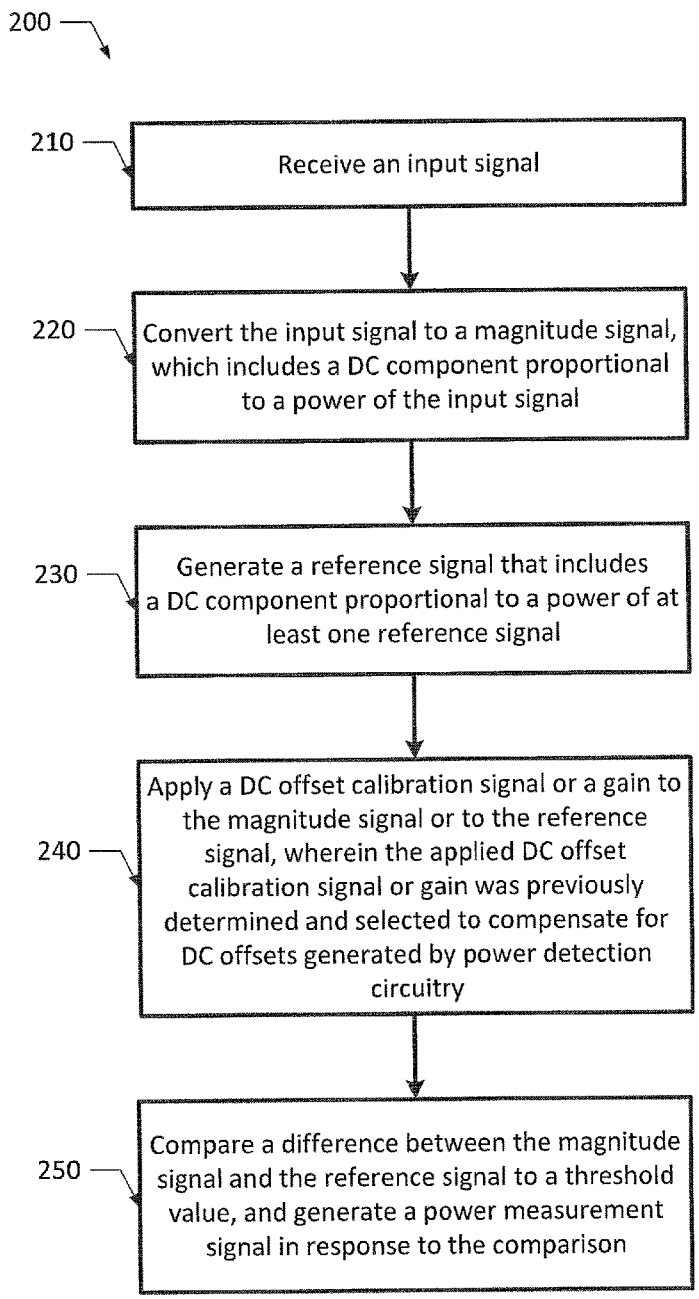
FIG. 7 is a flow chart illustrating one embodiment of a method to compensate for DC offsets in a power detector circuit.

FIG. 7 is a flow chart diagram illustrating one embodiment of a method 200 that may be used to compensate for undesired DC offsets generated in a power detector circuit, as shown in the embodiments of FIGS. 2-5. In the illustrated embodiment, method 200 begins by receiving an input signal having an input frequency in step 210, and converting the input signal to a magnitude signal in step 220. This magnitude signal includes a DC component proportional to a power of the input signal. In step 230, the method generates a DC reference signal that includes a DC component proportional to a power of at least one input reference signal. In step 240, the method applies a previously determined DC offset calibration signal (e.g., voltage and/or current) or a previously determined gain to the magnitude signal or to the reference signal in order to compensate for undesired DC offsets generated within the input circuitry 70 or the reference circuitry 80 for the power detector circuit. In step 250, the method compares a difference between the magnitude signal and the reference signal to a threshold value, and generates a power measurement signal in response to the comparison. It is noted that additional and/or different steps could be used for the normal mode of operation as desired.

FIG. 8 illustrates a third embodiment of power detector circuit 30, which includes error compensation circuitry 60 that is configured to select an adjustable digital input value, which when supplied to the reference circuitry 80, compensate for the undesired DC offsets (Voff1, Voff2, Voff3, and Voff4) generated within the power detector circuit.

Like the previously disclosed embodiments, the power detector circuit 30 shown in FIG. 8 includes input circuitry 70, reference circuitry 80, comparison circuitry 90 and error compensation circuitry. As in the previous embodiments, the input circuitry 70 includes a first non-linear element 32 coupled to receive the RF input signal, and a low pass filter 34 coupled to the first non-linear element for generating a magnitude signal, which includes a DC component proportional to the power of the RF input signal, and includes undesired DC offsets (Voff1, Voff2). Likewise, the reference circuitry 80 includes a pair of non-linear elements 36 and 38, which are coupled to receive equal and opposite input reference signals (DCREF+ and DCREF−) and configured to generate a reference signal in response thereto, which can also include undesired DC offsets (Voff3, Voff4).

Unlike the previously disclosed embodiments, the reference circuitry 80 shown in FIG. 8 includes a pair of digital-to-analog converters (DACs) 50 and 52, which are coupled to receive a pair of N-bit digital inputs for generating the equal and opposite reference signals. As described in more detail below, the N-bit digital inputs may be tuned during a calibration phase to compensate for the undesired DC offsets (Voff1, Voff2, Voff3, Voff4) generated within the power detector circuit 30. When the N-bit digital inputs are supplied to the reference circuitry 80 during normal operation, the reference circuitry 80 may be configured to generate a reference signal, which includes a DC component proportional to the power of the reference signal and a second DC offset calibration component, which compensates for the undesired DC offsets.

In order to calibrate the N-bit digital inputs, the power detector circuit 30 shown in the embodiment of FIG. 8 includes a first switch (SW1), a second switch (SW2), a calibration circuit 54 and error compensation circuitry 60. The first switch (SW1) is coupled to supply the RF input signal to the input circuitry 70 during normal operation of the power detector circuit, and the second switch is coupled to supply a calibration signal to the input circuitry 70 during a calibration phase of the power detector circuit. Calibration circuit 54 is coupled to the second switch (SW2), and configured to generate the calibration signal with a desired amplitude and frequency, which is substantially equal to an amplitude (e.g., a target amplitude desired for the RF input signal during normal operation) and frequency of the RF input signal.

In one embodiment, calibration circuit 54 may include a clock source 56 and a programmable attenuator 58, as shown in FIG. 8. Clock source 56 is configured to generate the calibration signal with a frequency, which is substantially equal to the frequency of the RF input signal (i.e., a frequency within the frequency band of interest to the power detector circuit). The programmable attenuator 58 receives the calibration signal frequency from clock source 56 and scales the amplitude of the calibration signal to a desired amplitude (e.g., a target amplitude desired for the RF input signal during normal operation).

As shown in FIG. 8, error compensation circuitry 60 is coupled to the first switch (SW1), the second switch (SW2) and the reference DACs 50 and 52. During the calibration phase, error compensation circuitry 60 opens the first switch (SW1) to disconnect the RF input signal from the power detector circuit 30, and closes the second switch (SW2) to supply the calibration signal generated by calibration circuit 54 to the input circuitry 70. As noted above, calibration circuit 54 may be configured to generate a calibration signal having a frequency and amplitude similar to that of the RF input signal during normal operation. Once the calibration signal is supplied to the input circuitry 70, error compensation circuitry 60 adjusts the N-bit digital inputs supplied to DACs 50 and 52 until comparator 40 determines that the difference between the magnitude signal and the reference signal is equal to the threshold value (e.g., 0V). When this occurs, the adjusted digital inputs are stored for later use during normal operation.

In some cases, calibration may be performed once, at a single frequency, to determine the N-bit digital inputs needed to compensate for the undesired DC offsets (Voff1, Voff2, Voff3, and Voff4) generated within the power detector circuit 30. In other cases, calibration may be performed at more than one frequency, and the N-bit digital inputs from each calibration can be combined (e.g., averaged) to improve the frequency flatness of this scheme. In yet other cases, calibration may be repeated periodically, at one or more frequencies, to remove DC offset variation and dynamic errors generated within the power detector circuit due to temperature changes.

During operation of the power detector circuit, error compensation circuitry 60 opens the second switch (SW2) to disconnect calibration circuit 54 from the power detector circuit 30, closes the first switch (SW1) to connect the RF input signal to the input circuitry 70, and supplies the stored digital inputs to DACs 50 and 52 to generate the reference signal. In doing so, the reference signal generated by the reference circuitry 80 includes a DC component proportional to the power of the input reference signal and a DC offset calibration signal, which effectively compensates for the undesired DC offsets.

In addition to compensating for undesired DC offsets (Voff1, Voff2, Voff3, and Voff4) generated within the power detector circuit, the error compensation circuitry 60 and calibration method shown in FIG. 8 cancels high-frequency mismatches in the power detector circuit. In other words, the calibration method shown in FIG. 8 may be performed using a calibration signal (or tone), which emulates a known RF signal, thereby enabling frequency dependent behavior to be replicated and compensated for. In some cases, the calibration method shown in FIG. 8 may be used to further increase the accuracy of the power detector circuits shown in FIGS. 2 and 4. However, this calibration method may not be desired in all applications, since it is generally more complicated, consumes more power and requires the RF input frequency to be known.

Figure 9:
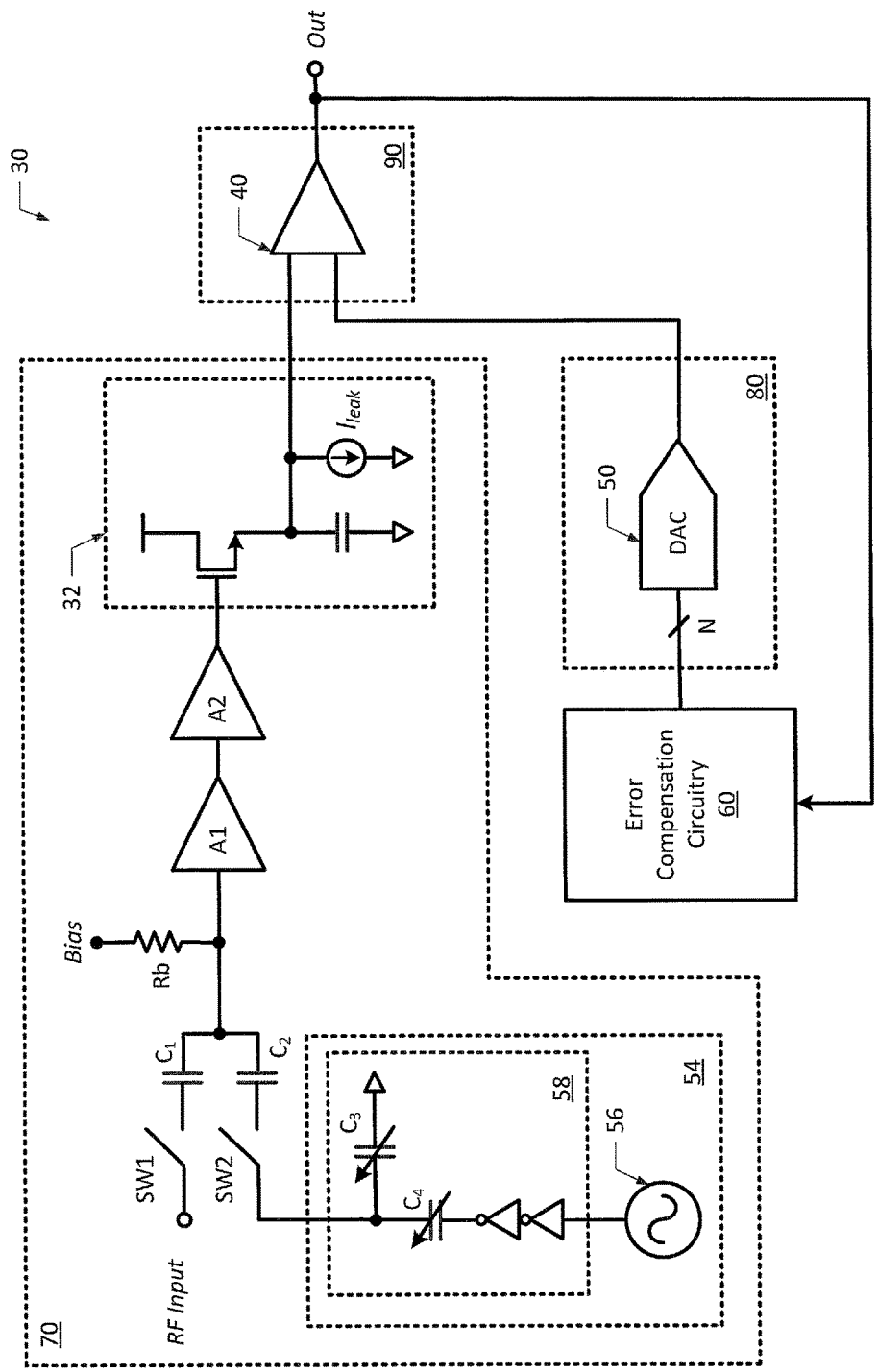
FIG. 9 is a simplified circuit diagram illustrating one embodiment of the power detector circuit shown in FIG. 8.

FIG. 9 is a simplified circuit diagram illustrating one embodiment of the power detector circuit 30 shown in FIG. 8. In the exemplary embodiment shown in FIG. 9, the RF input signal is capacitively coupled into power detector circuit 30 through switch (SW1) and capacitor ($C_1$). The output of clock source 56 is amplitude-scaled by a programmable capacitive divider ($C_3$ and $C_4$) and capacitively coupled into power detector circuit 30 through switch (SW2) and capacitor ($C_2$). The clock source and capacitive dividers can be implemented in a variety of different ways. For example, the clock source can be a Phase Locked Loop (PLL) built around an LC oscillator or a ring oscillator. The PLL can be a conventional analog PLL, an all-digital PLL or one of many variants employing a mix of analog and digital techniques.

In the exemplary embodiment shown in FIG. 9, a bias voltage (Bias) is coupled to a pair of RF gain stages (A1 and A2), which are used to amplify the RF input signal (or the calibration signal during the calibration phase) to a level sufficiently high to drive non-linear element 32. It is generally desirable to amplify the RF input signal (or the calibration signal) before applying it to the non-linear element, because large RF amplitudes generally result in a stronger response from non-linear elements, which improves the overall accuracy of the power detector circuit. However, the RF gain stages used to perform such amplification introduce their own errors (e.g., in the form of gain variation due to process, voltage and temperature variations, and also due to mismatch). The tone-based calibration method shown in FIGS. 8 and 9 corrects for these errors by calibrating them out.

In the exemplary embodiment shown in FIG. 9, non-linear element 32 is an amplitude tracking stage with finite memory (otherwise referred to as a peak track and hold circuit). At any given time, the output of the amplitude tracking stage holds the largest amplitude seen at its input over its memory span. Current, Ileak, adjusts the memory span of the amplitude tracking stage. The amplitude detected by non-linear element 32 is supplied to comparator 40, which compares the detected amplitude with a programmable reference voltage generated by a DAC (50).

During calibration, switch SW1 is turned OFF to disconnect the RF input signal, calibration circuit 54 is configured to generate a calibration signal at the desired RF amplitude and frequency, and switch SW2 is turned ON to supply the calibration signal to the power detector circuit 30. The N-bit digital input supplied to DAC 50 is adjusted to find the input that just trips comparator 40. This is the calibration code that compensates for error sources in the system, both DC and RF. During normal operation, switch SW2 and calibration circuit 54 are turned OFF, and switch SW1 is turned ON to connect the RF input signal to the power detector circuit. The previously determined N-bit calibration code is supplied to the DAC input, so that the power detector circuit 30 can accurately detect the level of the RF input signal. Although not shown, the error compensation circuitry 60 in FIG. 9 can also be coupled to control switch SW1 and switch SW2 similar to what is described with respect to FIG. 8 above.

It will be appreciated to those skilled in the art having the benefit of this disclosure that this disclosure is believed to provide embodiments of power detector circuits, calibration methods, and methods performed during operation of the power detector circuits described herein to compensate for undesired DC offsets generated within the power detector circuits. Further modifications and alternative embodiments of various aspects of the disclosure will be apparent to those skilled in the art in view of this description. It is to be understood that the various embodiments of the AGC circuits and methods shown and described herein are to be taken as the presently preferred embodiments. Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. A power detector circuit, comprising:
   input circuitry coupled to receive an input signal having an input frequency and configured to generate a magnitude signal including a DC component proportional to power of the input signal;
   reference circuitry coupled to receive a programmable digital input signal corresponding to an input reference signal, and further configured to generate a reference signal including a DC component;
   comparison circuitry configured to compare the magnitude signal and the reference signal, and further configured to generate a power measurement signal in response to the comparison; and
   error compensation circuitry configured, in a calibration mode, to select a programmable digital input signal based on the power measurement signal, wherein the error compensation circuitry is coupled, in a normal mode, to supply the programmable digital input signal to the reference circuitry to compensate for one or more DC offsets generated by the input circuitry or the reference circuitry.

2. The power detector circuit of claim 1, wherein the comparison circuitry is configured to compare a difference between the magnitude signal and the reference signal to a threshold value.

3. The power detector circuit of claim 1, wherein the comparison circuitry is configured to directly compare the magnitude signal to the reference signal.

4. The power detector circuit of claim 1, wherein the input circuitry comprises a first non-linear element coupled to receive the input signal and configured to generate the magnitude signal.

5. The power detector circuit of claim 1, wherein the reference circuitry comprises:
   a pair of digital-to-analog converters (DACs) coupled to receive a pair of programmable digital inputs, and configured to generate equal and opposite reference signals corresponding thereto; and
   a pair of non-linear elements coupled to receive the equal and opposite reference signals and configured to generate the reference signal.

6. The power detector circuit of claim 1, further comprising:
   a first switch coupled to supply the input signal to the input circuitry during the normal mode for the power detector circuit; and
   a second switch coupled to supply a calibration signal to the input circuitry during the calibration mode for the power detector circuit.

7. The power detector circuit of claim 6, further comprising a signal generator coupled to the second switch and configured to generate the calibration signal with an adjustable amplitude and frequency.

8. The power detector circuit of claim 7, wherein the signal generator comprises:
   a clock source configured to generate the calibration signal with a selected frequency; and
   a programmable attenuator configured to scale an amplitude of the calibration signal.

9. The power detector circuit of claim 6, wherein the error compensation circuitry is coupled to the first switch, the second switch, the reference circuitry, and the comparison circuitry.

10. The power detector circuit of claim 9, wherein the error compensation circuitry, in the calibration mode, is configured to open the first switch and close the second switch to supply the calibration signal to the input circuitry, to receive the power measurement signal from the comparison circuitry, and to adjust the programmable digital input signal based upon the power measurement signal.

11. The power detector circuit of claim 9, wherein the error compensation circuitry, in the normal mode, is configured to close the first switch and open the second switch to supply the input signal to the input circuitry and to supply the adjusted programmable digital input signal to the reference circuitry.

12. A method to detect power, comprising:
   with input circuitry:
     receiving an input signal having an input frequency; and
     generating a magnitude signal including a DC component proportional to power of the input signal;
   with reference circuitry:
     receiving a programmable digital input signal corresponding to an input reference signal; and
     generating a reference signal including a DC component based upon the programmable digital input signal;
   comparing the magnitude signal and the reference signal;
   generating a power measurement signal in response to the comparison; and
   in a calibration mode, selecting a programmable digital input signal based on the power measurement signal; and
   in a normal mode, applying the programmable digital input signal to the reference circuitry to compensate for one or more DC offsets generated by the input circuitry or the reference circuitry.

13. The method of claim 12, wherein the comparing comprises comparing a difference between the magnitude signal and the reference signal to a threshold value.

14. The method of claim 12, wherein the comparing comprises directly comparing the magnitude signal to the reference signal.

15. The method of claim 12, wherein the input circuitry comprises a first non-linear element coupled to receive the input signal and configured to generate the magnitude signal.

16. The method of claim 12, wherein the reference circuitry comprises:
   a pair of digital-to-analog converters (DACs) coupled to receive a pair of programmable digital inputs, and generating equal and opposite reference signals corresponding thereto; and
   a pair of non-linear elements receiving the equal and opposite reference signals and generating the reference signal.

17. The method of claim 12, further comprising closing a first switch to supply the input signal to the input circuitry during the normal mode for the power detector circuit, and closing a second switch to supply a calibration signal to the input circuitry during the calibration mode for the power detector circuit.

18. The method of claim 17, further comprising using a signal generator to generate the calibration signal with an adjustable amplitude and frequency.

19. The method of claim 17, further comprising, in the calibration mode, opening the first switch and closing the second switch to supply the calibration signal to the input circuitry, receiving the power measurement signal, and adjusting the programmable digital input signal based upon the power measurement signal.

20. The method of claim 17, further comprising, in the normal mode, closing the first switch and opening the second switch, supplying the input signal to the input circuitry, and supplying the adjusted programmable digital input signal to the reference circuitry.

* * * * *